United States Patent
Montez et al.

(10) Patent No.: US 9,463,973 B2
(45) Date of Patent: Oct. 11, 2016

(54) REDUCING MEMS STICTION BY INTRODUCTION OF A CARBON BARRIER

(71) Applicants: Ruben B. Montez, Cedar Park, TX (US); Robert F. Steimle, Austin, TX (US)

(72) Inventors: Ruben B. Montez, Cedar Park, TX (US); Robert F. Steimle, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/529,824

(22) Filed: Oct. 31, 2014

(65) Prior Publication Data

US 2015/0054096 A1     Feb. 26, 2015

Related U.S. Application Data

(62) Division of application No. 13/718,598, filed on Dec. 18, 2012, now Pat. No. 8,895,339.

(51) Int. Cl.
  *B81B 3/00* (2006.01)
  *B81C 1/00* (2006.01)
  *G01P 15/08* (2006.01)

(52) U.S. Cl.
  CPC .......... *B81B 3/0005* (2013.01); *B81C 1/0038* (2013.01); *B81C 1/00952* (2013.01); *G01P 15/0802* (2013.01); *B81B 2201/0221* (2013.01); *B81B 2201/0235* (2013.01); *B81B 2203/0181* (2013.01); *B81B 2203/06* (2013.01); *B81C 2201/0169* (2013.01); *B81C 2201/112* (2013.01); *G01P 2015/0871* (2013.01); *G01P 2015/0874* (2013.01)

(58) Field of Classification Search
  USPC ............... 257/415; 73/514.32; 333/186, 197; 438/77
  See application file for complete search history.

(56) References Cited

U.S. PATENT DOCUMENTS

| | | | |
|---|---|---|---|
| 5,906,708 A | 5/1999 | Robinson et al. | |
| 6,275,324 B1 | 8/2001 | Sneh | |
| 6,404,028 B1 | 6/2002 | Hetrick | |
| 6,531,331 B1 | 3/2003 | Bennett et al. | |
| 6,838,304 B2 | 1/2005 | Ikeda et al. | |
| 6,909,186 B2 * | 6/2005 | Chu | 257/751 |
| 7,121,141 B2 * | 10/2006 | McNeil | 73/514.32 |
| 7,652,547 B1 * | 1/2010 | Wittwer et al. | 333/186 |
| 2009/0140323 A1 * | 6/2009 | Fazan | 257/324 |
| 2012/0080690 A1 | 4/2012 | Berger et al. | |

FOREIGN PATENT DOCUMENTS

| | | |
|---|---|---|
| EP | 2489629 A3 | 8/2012 |
| WO | 2007021396 A2 | 2/2007 |

* cited by examiner

*Primary Examiner* — Sheng Zhu

(57) ABSTRACT

A mechanism for reducing stiction in a MEMS device by decreasing an amount of carbon from TEOS-based silicon oxide films that can accumulate on polysilicon surfaces during fabrication is provided. A carbon barrier material film is deposited between one or more polysilicon layer in a MEMS device and the TEOS-based silicon oxide layer. This barrier material blocks diffusion of carbon into the polysilicon, thereby reducing accumulation of carbon on the polysilicon surfaces. By reducing the accumulation of carbon, the opportunity for stiction due to the presence of the carbon is similarly reduced.

8 Claims, 7 Drawing Sheets

REDUCING MEMS STICTION BY INTRODUCTION OF A CARBON BARRIER

This application is a divisional application of a U.S. patent application entitled "Reducing MEMS Stiction by Introduction of a Carbon Barrier", having a serial number of Ser. No. 13/718,598, having a filing date of Dec. 18, 2012, having common inventors, and having a common assignee, all of which is incorporated by reference in its entirety.

BACKGROUND

1. Field

This disclosure relates generally to manufacture of microelectromechanical systems (MEMS), and more specifically, to reducing stiction in MEMS devices through the use of a carbon barrier layer during formation of the MEMS device.

2. Related Art

Microelectromechanical systems (MEMS) devices are micromechanical devices that provide moving parts having features with dimensions below 100 µm. These moving parts are formed using micro-fabrication techniques. MEMS devices have holes, cavities, channels, cantilevers, membranes, and the like. These devices are typically based on silicon materials and use a variety of techniques to form the physical structures and to free the structures for movement.

Stiction is a static friction force that is a recurring problem with typical MEMS devices. While any solid objects pressing against each other without sliding require some threshold of force (stiction) to overcome static cohesion, the mechanisms generating this force can be different for MEMS devices. When two surfaces with areas below the micrometer range come into close proximity, the surfaces may adhere together due to electrostatic and/or Van der Waals forces. Stiction forces at this scale may also be related to hydrogen bonding or residual contamination on the surfaces.

For MEMS devices such as accelerometers, surfaces such as over-travel stops can come into close proximity or contact during use at the limits of the device design or during manufacture of the device. In those situations, stiction forces can cause the MEMS device parts (e.g., a teeter-totter accelerometer mechanism) to freeze in place and become unusable. Traditional methods of avoiding such close proximity travel or contact include increasing spring constants and increasing distance between parts of the MEMS device. But these methods can cause decreased sensitivity of the device to acceleration, and therefore decreased utility of the MEMS device. It is therefore desirable to provide a mechanism for reducing stiction-related interactions of MEMS devices without also decreasing sensitivity of the MEMS device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a mechanism for reducing stiction in a MEMS device by decreasing an amount of carbon from TEOS-based silicon oxide films that can accumulate on polysilicon surfaces during fabrication. In one embodiment of the present invention, a carbon barrier material film is deposited between one or more polysilicon layer in a MEMS device and the TEOS-based silicon oxide layer. This barrier material blocks diffusion of carbon into the polysilicon, thereby reducing accumulation of carbon on the polysilicon surfaces. By reducing the accumulation of carbon, the opportunity for stiction due to the presence of the carbon is similarly reduced.

Figure 1:
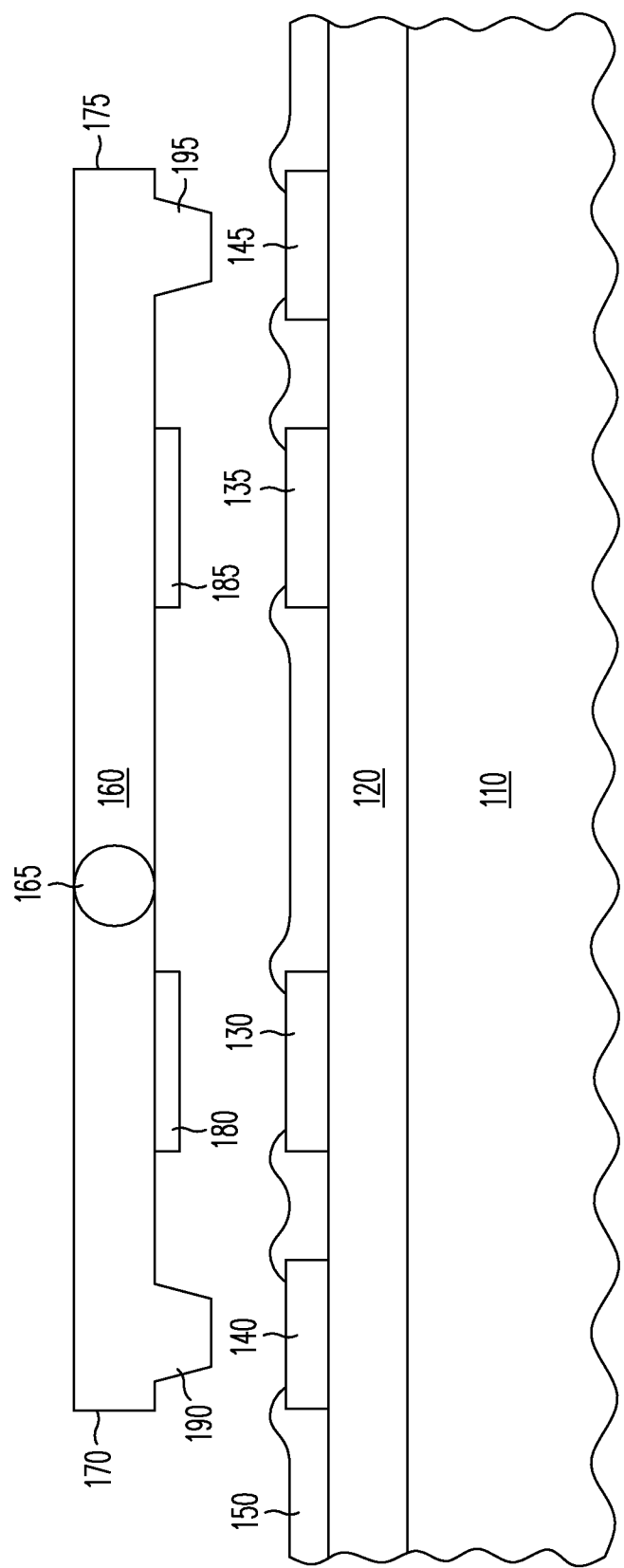
FIG. 1 is a simplified block diagram illustrating a cross section view of an accelerometer known in the art.

FIG. 1 is a simplified block diagram illustrating a cross section view of a teeter totter accelerometer known in the prior art. The accelerometer includes a substrate 110 with an insulating layer 120. Substrate 110 can be, for example, a silicon wafer and insulating layer 120 can be, for example, a silicon oxide or silicon nitride. In some cases, insulating layer 120 can be thermally grown from substrate 110 or the insulating layer can be deposited.

Fixed electrodes 130 and 135 are formed on top of insulating layer 120, along with travel stop regions 140 and 145. The layer forming fixed electrodes 130 and 135 and travel stop regions 140 and 145 is typically polysilicon and is formed using conventional techniques, including patterning as desired for the application. The layer forming the fixed electrodes and travel stop regions can alternatively be amorphous silicon, a nitride, a metal-containing material, another suitable material, and the like, or any combination thereof. A dielectric layer 150 is formed to electrically isolate the electrodes and travel stop regions from other elements of the MEMS accelerometer. Dielectric layer 150 can be formed from a variety of materials, including, for example, silicon nitride, silicon dioxide, silicon oxynitride, and the like.

A pivoting proof mass 160 is configured to move in a manner similar to that of a teeter totter in response to acceleration of the MEMS device or a system incorporating the MEMS device. Pivoting proof mass 160 can be configured in a manner such that there is an imbalance between a side 170 of the pivoting proof mass and side 175 of the pivoting proof mass through pivot point 165. The amount of imbalance has an effect of making the device more or less sensitive to acceleration. An electrode 180 configured on side 170 of the pivoting proof mass is associated with fixed electrode 130, while an electrode 185 on the pivoting proof mass is associated with fixed electrode 135. In addition, a travel stop 190 on side 170 of the pivoting proof mass is associated with travel stop region 140 and a travel stop 195 on side 175 of the pivoting proof mass is associated with travel stop region 145. Pivoting proof mass 160 and travel stops 190 and 195 are typically formed of polysilicon.

Electrode 180 and fixed electrode 130 form a first variable sense capacitor, while electrode 185 and fixed electrode 135 form a second variable sense capacitor. Changes in the capacitances of the first and second variable sense capacitors can be combined to provide a differential output from the MEMS accelerometer. Fabrication of the MEMS accelerometer in FIG. 1 can be performed using known MEMS fabrication processes.

Figure 2:
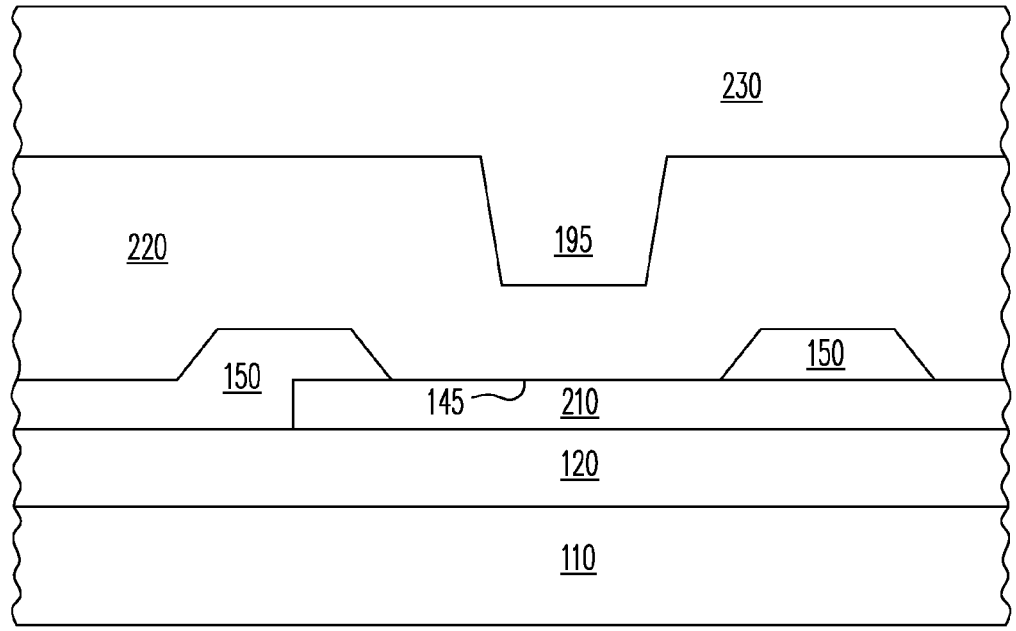
FIG. 2 is a simplified block diagram illustrating a close up of a cross-section view of the travel stop region at an end of a MEMS accelerometer during a stage of fabrication.

FIG. 2 is a simplified block diagram illustrating a close up of a cross section view of the travel stop region at end 175 of the MEMS accelerometer during a stage of fabrication. As discussed above, a substrate 110 is provided with insulating layer 120, where substrate 110 can be a silicon wafer and insulating layer 120 can be a silicon oxide. A first polysilicon layer 210 is formed on insulating layer 120, forming, in part, travel stop region 145. Dielectric layer 150 is formed over polysilicon layer 210 and insulating layer 120, in order to prevent excessive etching of insulating layer 120, for example. A sacrificial layer 220 is formed on top of patterned dielectric layer 150 and exposed regions of polysilicon layer 210. Sacrificial layer 220 is commonly formed using tetraethyl orthosilicate (TEOS) gas to form a sacrificial layer of silicon oxide or the sacrificial layer can be formed of phosphosilicate glass (PSG). The sacrificial layer can be patterned to form a "molding" for the next layer of the MEMS device. Sacrificial layer 220 may be annealed at this time at elevated temperatures (e.g., in excess of 900 C.). A second polysilicon layer 230 can be formed on the patterned sacrificial layer to form pivoting proof mass 160, including travel stop 195. The buildup of patterned layers can continue as needed for the application.

Figure 3:
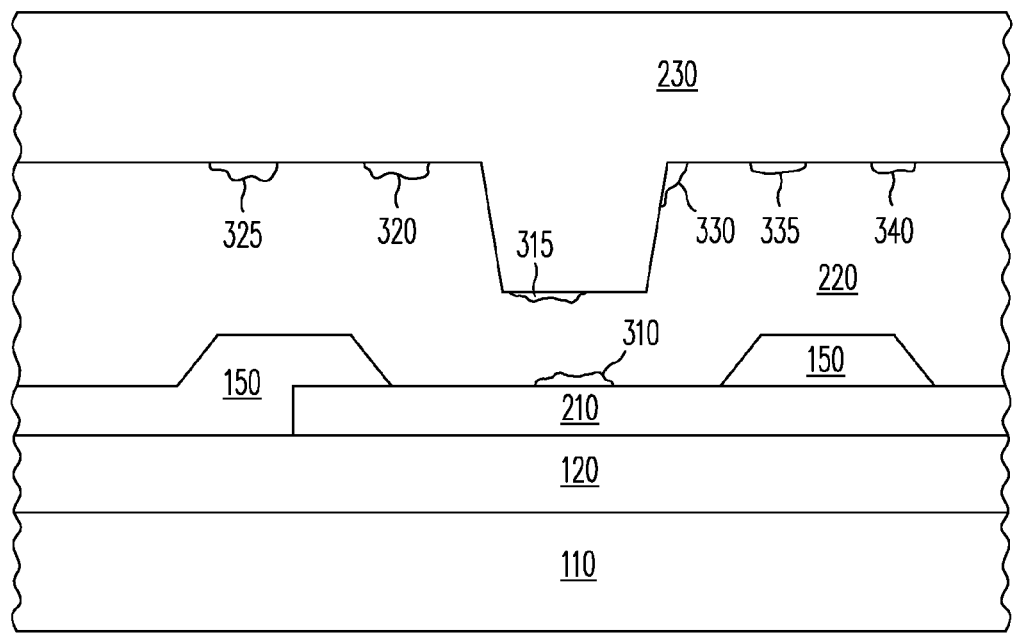
FIG. 3 is a simplified block diagram illustrating a cross-section view of the travel stop region during a stage of fabrication subsequent to deposition of a second polysilicon layer.

FIG. 3 is a simplified block diagram illustrating a cross-section view of the travel stop region during a stage of fabrication subsequent to deposition of second polysilicon layer 230. Typical MEMS processing provides for the second polysilicon layer to be deposited at low temperature and low pressure. In one embodiment, in order to relieve stresses on second polysilicon layer 230, the structure is annealed by subjecting the structure to temperatures in excess of 1000 C. for an hour or more. During this anneal, the polysilicon grains in polysilicon layer 230 realign and thereby reduce intrinsic stress, and will provide a low energy, relaxed polysilicon structure in the resulting device.

During the anneal, the entire MEMS device structure is subjected to the heating, including sacrificial layer 220. As stated above, sacrificial layer 220 is typically a silicon oxide layer formed using TEOS gas. TEOS includes a significant amount of carbon chains that get incorporated into the sacrificial layer. During the anneal heating, volatile compounds in the sacrificial layer are released from the layer, but carbon remains within the sacrificial layer. Further, carbon in the sacrificial layer that is near the polysilicon layers can diffuse into the surfaces of the polysilicon layers and form carbon deposits along the interface region between the polysilicon layers and the sacrificial layer (e.g., carbon deposits 310, 315, 320, 325, 330, 335, and 340).

Figure 4:
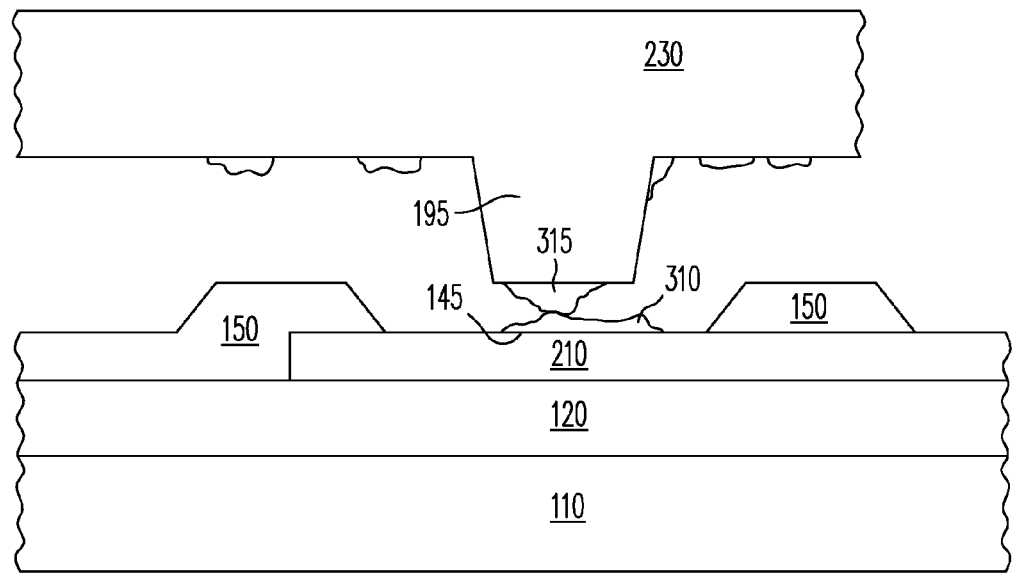
FIG. 4 is a simplified block diagram illustrating a cross-section view of the travel stop region subsequent to removal of a sacrificial layer, in a position that can occur during use of the accelerometer or during removal of the sacrificial layer.

FIG. 4 is a simplified block diagram illustrating a cross-section view of the travel stop region subsequent to removal of the sacrificial layer, in a position that can occur during use of the accelerometer or during removal of the sacrificial layer. Sacrificial layer 220 is commonly removed using an isotropic wet etch process selective to the sacrificial layer. But capillary forces due to surface tension of the liquid used for the etching process between travel stop 195 and polysilicon travel stop region 145 can draw the surfaces together. As illustrated, a consequence of the surfaces being drawn together results in bringing carbon deposits 310 and 315 into contact. A carbon-coated surface can be significantly more susceptible to adhesion than a clear surface, especially if the carbon region is wet such as during a wet etching process.

Similarly, the carbon-coated surfaces can be brought into contact during use of the device. For example, an acceleration A sufficient to exceed the design specification for the accelerometer is exerted upon the device. This causes travel stop 195 to impact polysilicon travel stop region 145, thereby preventing contact of electrode 185 to fixed electrode 135. In this case, stiction forces due to the carbon deposits, along with other sources of stiction (e.g., Van der Waals forces and electrostatic forces) can cause the parts to stay together and render the device inoperable.

Embodiments of the present invention provide a mechanism to reduce carbon deposition on the polysilicon surfaces of, for example, both travel stop 195 and travel stop region 145 in a MEMS device. This reduction in carbon deposition will consequently reduce stiction due to carbon deposits. This is accomplished by forming a carbon barrier layer between the TEOS-based sacrificial layer and the polysilicon layers of one or both of the pivoting proof mass and the fixed portion (e.g., the travel stop region).

Figure 5:
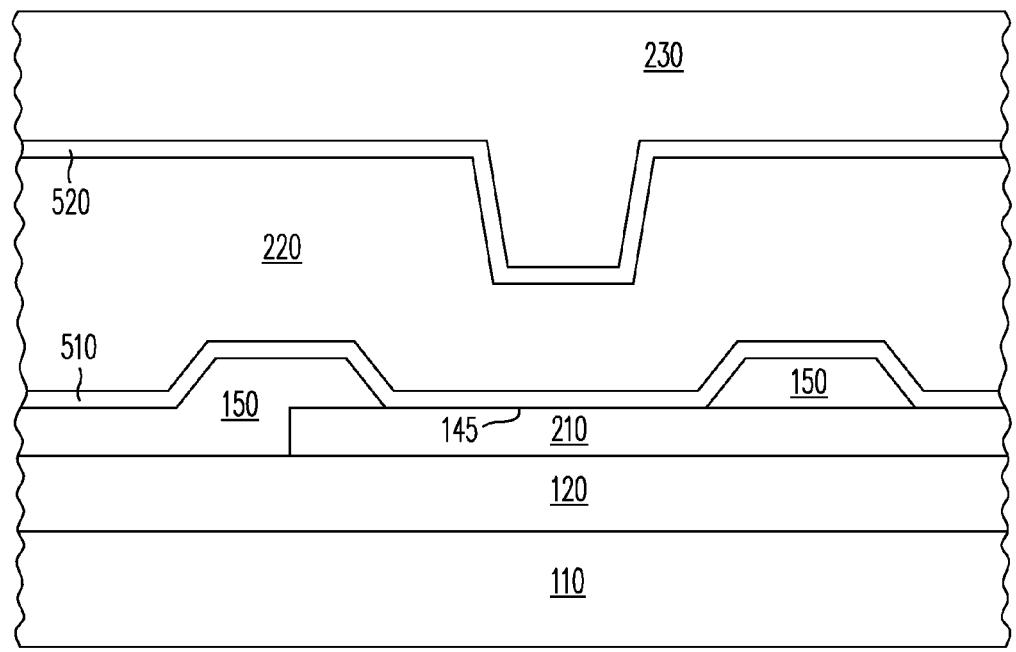
FIG. 5 is a simplified block diagram illustrating a cross-sectional view of the travel stop region during a step in processing, in accord with embodiments of the present invention.

FIG. 5 is a simplified block diagram illustrating a cross-sectional view of the travel stop region of a MEMS device during a step in processing, in accord with embodiments of the present invention. As discussed above, the travel stop region is formed over substrate 110 and insulating layer 120. First polysilicon layer 210 is formed over insulating layer 120, forming, in part, travel stop region 145. Dielectric layer 150 is formed over patterned polysilicon layer 210, again to electrically isolate patterned regions of the polysilicon layer.

As illustrated, a first barrier layer 510 is formed over first polysilicon layer 210 and dielectric layer 150. First barrier layer 510 prevents diffusion of carbon from a sacrificial layer into the surface of first polysilicon layer 210, and therefore reduces carbon deposition on the polysilicon layer. In one embodiment, poly-SiGeC is used for the first barrier layer, while in another embodiment silicon nitride is used. First barrier layer 510 can be formed using a low-pressure CVD process to deposit the first barrier layer. In one embodiment, no additional processing is required for formation of the film subsequent to deposition.

As discussed above, sacrificial layer 220 is formed using TEOS gas to form the sacrificial layer of silicon oxide. Subsequent to formation of sacrificial layer 220, a second barrier layer 520 is formed. The second barrier layer can be formed using the same techniques as those used for formation of the first barrier layer, or can be formed using different techniques should the application require it.

Subsequent to formation of second barrier layer 520, second polysilicon layer 230 is formed using a low temperature, low pressure deposition process. An anneal can then be performed to relieve stresses in the second polysilicon layer. As with the previously discussed anneal, heating to temperatures in excess of 1000 C. can both relieve stresses in the second polysilicon layer and cause volatile and carbon migration in the sacrificial layer. But the barrier layers prevent the carbon from diffusing into the polysilicon layers. By retaining the carbon in the sacrificial layer, the carbon is removed during a sacrificial layer etch removal such as that described in association with FIG. 4.

In one embodiment of the present invention, two barrier layers can be used as shown to prevent diffusion of carbon into both the first and second polysilicon layers. In another embodiment, either one of barrier layers 510 and 520 can be used to prevent diffusion of carbon into the associated one of the first and second polysilicon layers. By preventing diffusion of carbon into at least one of the polysilicon layers, issues related to carbon deposits sticking to other carbon deposits are still prevented. Other embodiments provide for removal of the barrier layer subsequent to or in conjunction with the wet etch removal of the sacrificial layer.

FIGS. 6A, 6B, 7A, and 7B are example secondary ion mass spectrometry (SIMS) depth resolution profiles showing the effect upon carbon diffusion into the polysilicon layer by including a barrier layer such as 510 or 520. In each figure, concentration levels, normalized to show relative differences in concentration (e.g., not actual concentration), are provided as a function of depth through a stack of materials labeled in the "A" diagram for each figure.

Figure 6A:
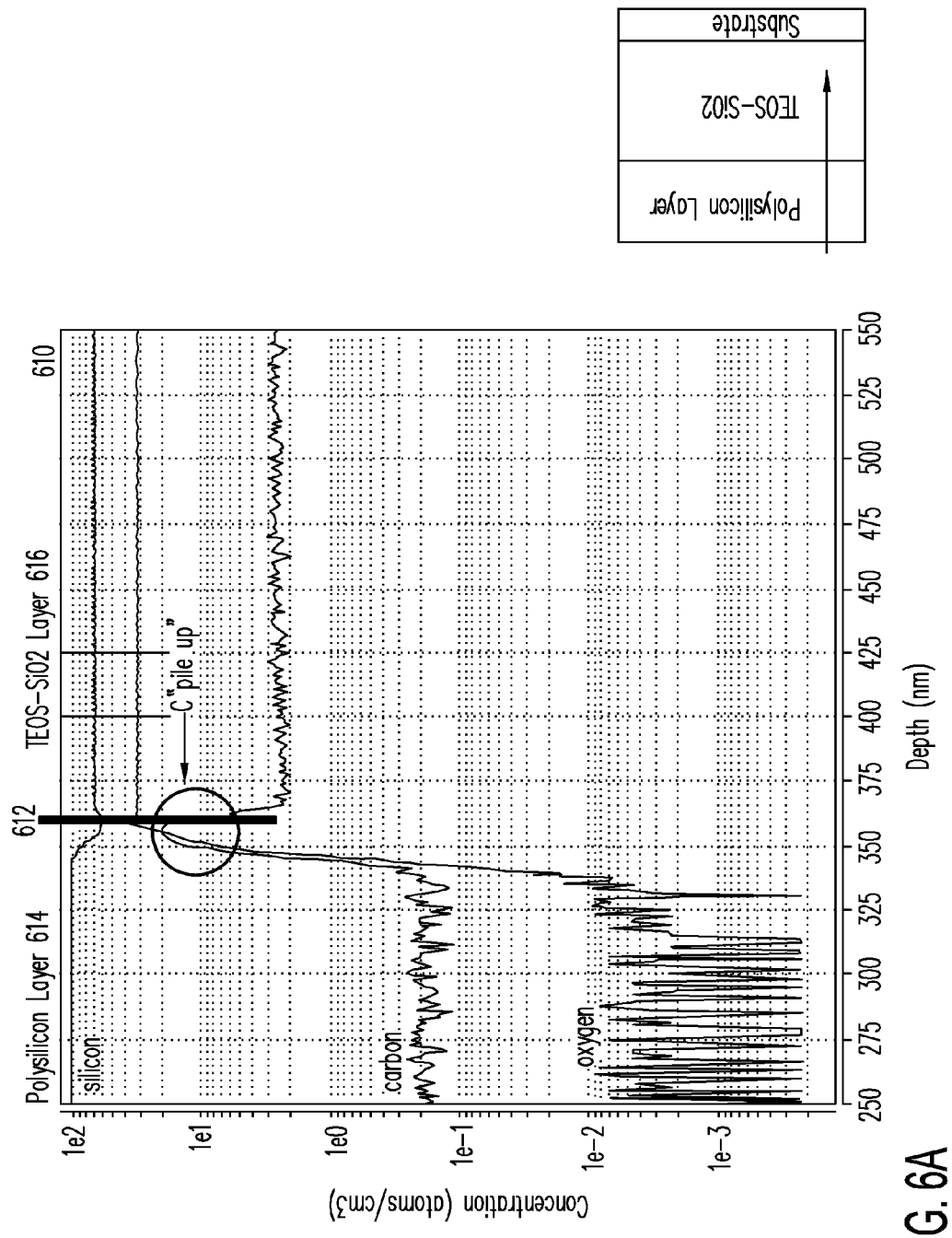
FIGS. 6A, 6B, 7A, and 7B are example secondary ion mass spectrometry (SIMS) depth resolution profiles showing the effect upon carbon diffusion into the polysilicon layer by inclusion of a barrier layer, in accord with embodiments of the present invention.

FIG. 6A provides a SIMS depth resolution profiles 610. SIMS depth resolution profile 610 illustrates silicon, carbon and oxygen normalized concentration levels through an interface 612 between a polysilicon layer 614 and a TEOS-based $SiO_2$ layer 616. SIMS depth resolution profile 610 shows concentration levels at varying depths through the interface subsequent to deposition of the TEOS-based $SiO_2$ layer but prior to heating that would be associated with an anneal. The carbon profile shows an increase in carbon levels at the interface region into the polysilicon layer to about 10 nm.

Figure 6B:
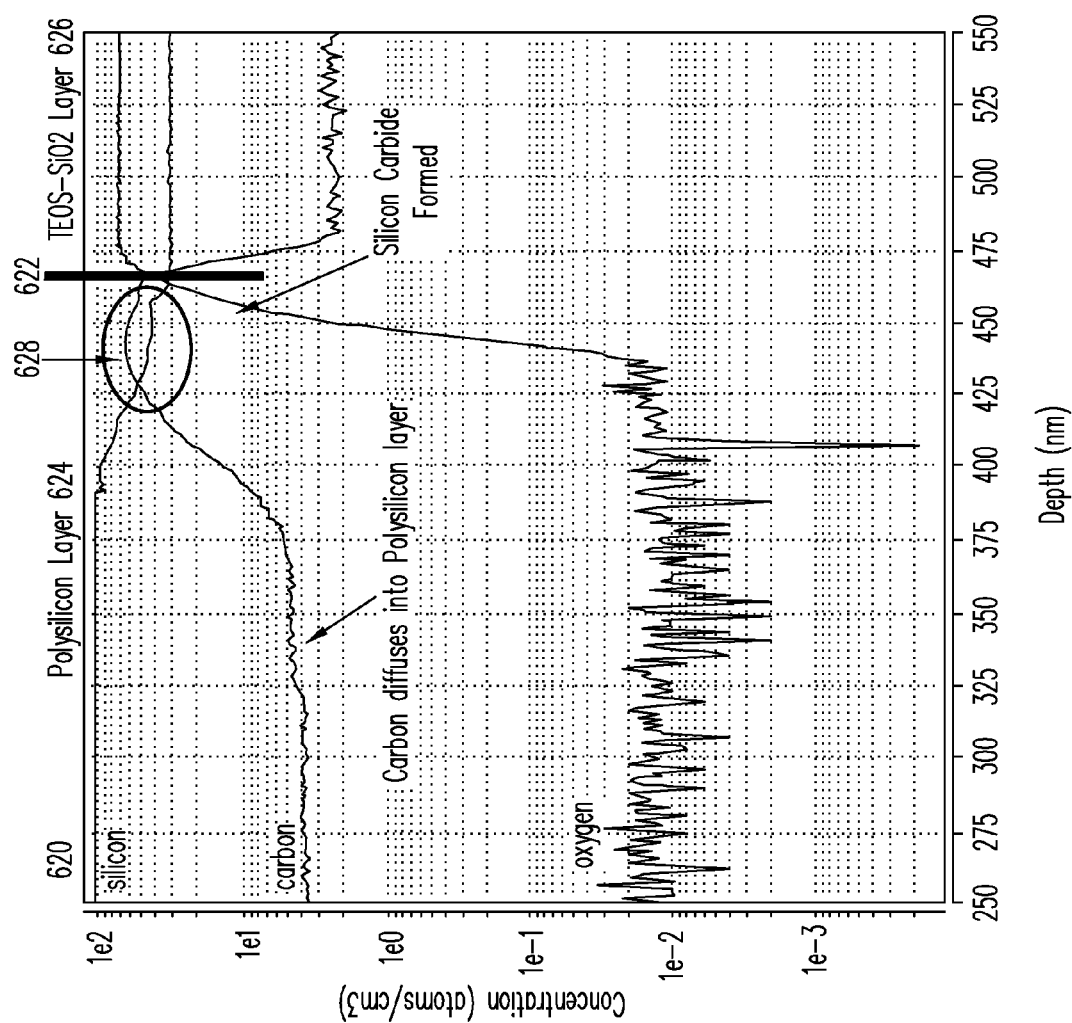

FIG. 6B provides a SIMS depth resolution profile 620. SIMS depth resolution profile 620 also shows normalized concentration levels at varying depths through the interface but subsequent to heating the structure to temperatures associated with an anneal. The carbon profile shows increased carbon levels throughout polysilicon layer 624, with especially elevated carbon levels to a depth of about 50 nm from interface 622 (e.g., region 628).

Figure 7A:
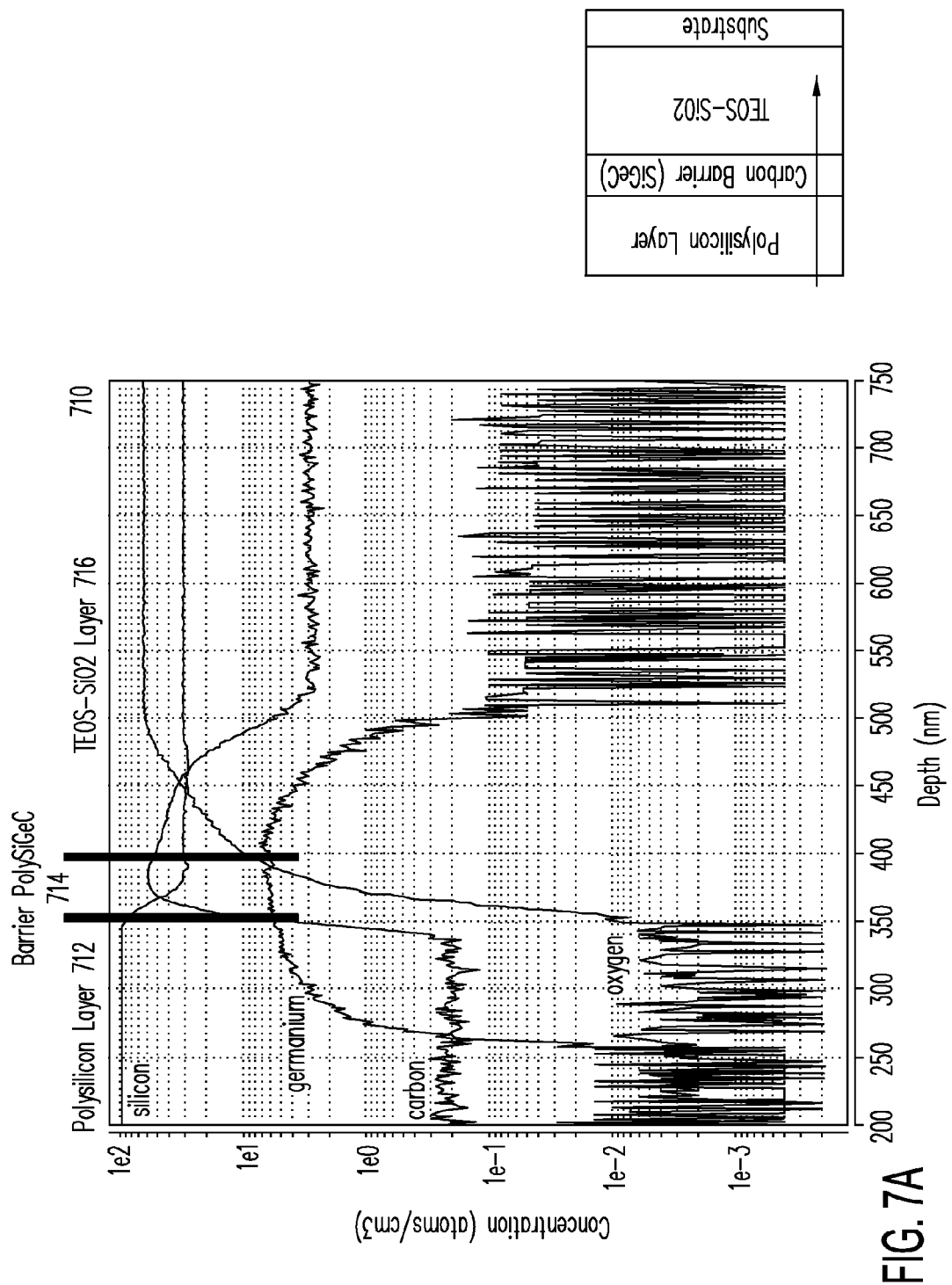
Figure 7B:
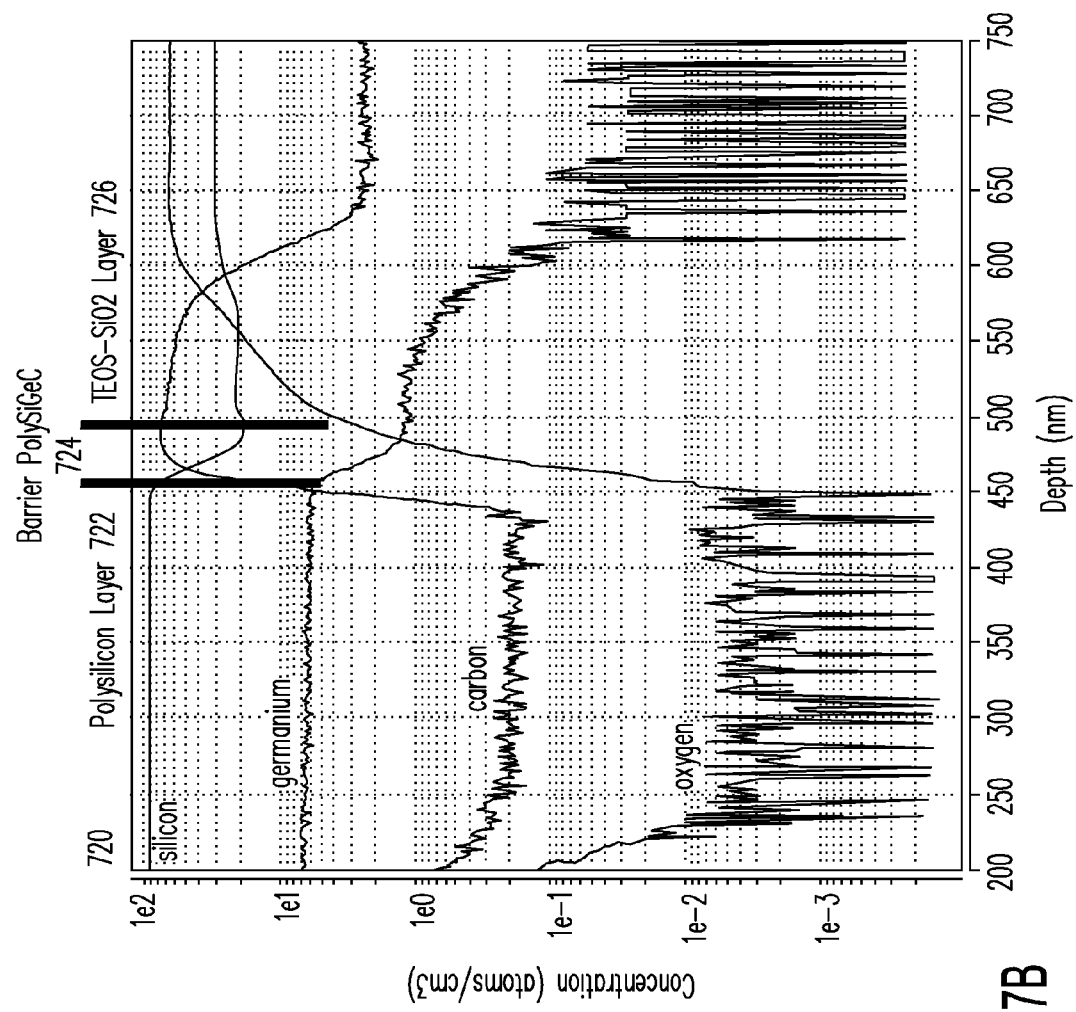

FIGS. 7A and 7B provides two SIMS depth resolution profiles in which a poly-SiGeC barrier layer is formed between the polysilicon layer and the TEOS-$SiO_2$ layer. The depth of the barrier poly-SiGeC layer is approximately 450 Å. As with FIG. 6A, in FIG. 7A, SIMS depth resolution profile 710 illustrates the concentration profiles prior to heating to anneal temperatures and, in FIG. 7B, SIMS depth resolution profile 720 illustrates the concentration profiles subsequent to heating to anneal temperatures. In both profiles illustrated in FIGS. 7A and 7B, carbon levels remain low within polysilicon layers 712 and 722, while the carbon levels in the TEOS-based $SiO_2$ layers remain higher. These figures illustrate that a 450 Å barrier layer formed by poly-SiGeC is sufficient to prevent diffusion of carbon from the TEOS-based $SiO_2$ layer into the polysilicon layer. In one embodiment, barrier layer thickness is kept below about 1000 Å for either barrier 510 or 520. For example, too thick a barrier layer 510 may affect subsequent photolithography processes.

Through the use of a carbon-diffusion barrier layer such as poly-SiGeC, carbon from an external source such as a TEOS-based $SiO_2$ layer is prevented from diffusing into an adjacent polysilicon region. The majority of the external carbon from the TEOS-based $SiO_2$ layer remains in the $SiO_2$ layer and can then be removed as part of the typical process flow for formation of MEMS devices. This will reduce the number of carbon-related stiction failures of MEMS devices (e.g., accelerometers) in the field and will also improve device yield during manufacture.

In addition, one advantage of reducing stiction in accelerometer-type MEMS devices is improved sensitivity of the device. In one type of traditional MEMS accelerometer, stiction force is countered by increasing a spring constant of the device. But increasing the spring constant decreases sensitivity of the MEMS device to light acceleration forces. In another type of traditional MEMS device, chances for stiction occurring are sought to be reduced by increasing the distance between the movable portions of the device and the fixed portions of the device. But this increases the distance between the capacitive plates and can therefore decrease differences in measured capacitance. Reducing stiction forces by using embodiments of the present invention allow for lower spring constants and smaller distances between parts, both of which can improve device sensitivity. Further, smaller overall device sizes can be realized by decreasing the distances between the parts. This can, in turn, provide a decreased footprint for each MEMS device, thereby allowing for incorporation of more MEMS devices in a system or a smaller system size.

By now it should be appreciated that there has been provided a method for manufacturing a micro-electromechanical systems device that includes: forming a first polysilicon layer over a substrate; forming a sacrificial layer over the first polysilicon layer where the sacrificial layer includes silicon oxide deposited using TEOS gas; forming a second polysilicon layer over the sacrificial layer; annealing the second polysilicon layer where the annealing includes heating the first and second polysilicon layers and the sacrificial layer to a temperature sufficient to relieve stress in the second polysilicon layer; and forming a carbon barrier layer between the sacrificial layer and one or more of the first and second polysilicon layers. The carbon barrier layer prevents diffusion of carbon into an adjacent polysilicon layer from the sacrificial layer during the annealing.

In one aspect of the above embodiment, the carbon barrier layer includes one of silicon nitride or silicon-germanium-carbon. In another aspect of the above embodiment, forming the carbon barrier layer includes depositing the carbon barrier layer to a thickness of about 45 nm or greater.

In still another aspect of the above embodiment, forming the carbon barrier layer includes forming the carbon barrier layer over and in contact with at least a portion of the first polysilicon layer and forming the carbon barrier layer prior to forming the sacrificial layer. In another aspect of the above embodiment, forming the carbon barrier layer includes forming the carbon barrier layer over and in contact with the sacrificial layer, where forming the carbon barrier layer is performed prior to forming the second polysilicon layer and at least a portion of the second polysilicon layer is formed in contact with the carbon barrier layer.

Another aspect of the above embodiment includes removing the sacrificial layer after annealing, using a wet etch. In a further aspect, the method includes removing the carbon barrier layer after annealing. Another aspect of the above embodiment further includes forming a first insulating layer over the substrate where the first polysilicon layer is formed over the first insulating layer, and forming a second insulating layer over at least a portion of the first polysilicon layer.

Another embodiment of the present invention provides a micro-electromechanical systems device that includes: a fixed surface having a first polysilicon layer formed over a substrate and a first insulating layer formed over at least a portion of the first polysilicon layer; a movable body including a second polysilicon layer providing a major surface facing the fixed surface; and a carbon barrier layer formed on at least one of the first polysilicon layer and the major surface of the second polysilicon layer. In one aspect of this embodiment, the carbon barrier layer includes one of silicon nitride or silicon-germanium-carbon.

In another aspect of the above embodiment, the carbon barrier layer includes a thickness sufficient to prevent diffusion of carbon into the adjacent polysilicon layer from a TEOS sacrificial layer used during manufacture of the MEMS device. In a further aspect, the thickness of the carbon barrier layer is at least about 45 nm. In another aspect of the above embodiment, the MEMS device is an accelerometer.

Another embodiment of the present invention provides a method of manufacturing a micro-electromechanical systems device, wherein the method includes: forming a fixed surface comprising a first layer of polysilicon; forming a movable body providing a major surface facing the fixed surface where at least a portion of the major surface is configured to contact at least a portion of the fixed surface at the at least a portion of the major surface includes a second layer of polysilicon; forming a sacrificial layer between the fixed surface of the movable body where the second sacrificial layer includes silicon oxide deposited using TEOS gas; and forming at least one of the first layer of polysilicon or the second layer of polysilicon such that carbon from the sacrificial layer does not diffuse into the at least one of the first layer or second layer of polysilicon.

In one aspect of the above embodiment, forming the at least one of the first layer of polysilicon or the second layer of polysilicon such that carbon from the sacrificial layer does not diffuse into the at least one of the first layer or second layer of polysilicon further includes forming a carbon barrier layer between the sacrificial layer and the at least one of the first layer or second layer of polysilicon. The carbon barrier layer prevent diffusion of carbon into the adjacent polysilicon layer from the sacrificial layer during an anneal of the second layer of polysilicon. In a further aspect, the carbon barrier layer includes one of silicon nitride or silicon-germanium-carbon. In another aspect of the above embodiment, forming the carbon barrier layer includes depositing the carbon barrier layer to a thickness of at least about 45 nm.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the description of embodiments of the invention relates to a teeter-totter type accelerometer. Embodiments of the present invention are not limited to teeter-totter accelerometers, but can include accelerometers having a mass suspended by springs, or other MEMS devices that have a potential for components to come in contact with one another during operation or manufacture. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A microelectromechanical systems (MEMS) device comprising:
    a fixed surface comprising a first polysilicon layer formed over a substrate and a first insulating layer formed over at least a portion of the first polysilicon layer;
    a moveable body comprising a second polysilicon layer providing a major surface facing the fixed surface; and
    a carbon barrier layer formed on the major surface of the second polysilicon layer, wherein the carbon barrier layer comprises silicon-germanium-carbon.

2. The MEMS device of claim 1 wherein the carbon barrier layer comprises:
    a thickness sufficient to prevent diffusion of carbon into the adjacent polysilicon layer from a TEOS sacrificial layer used during manufacture of the MEMS device.

3. The MEMS device of claim 2 wherein the thickness of the carbon barrier layer is at least about 45 nm.

4. The MEMS device of claim 1 wherein the MEMS device is an accelerometer.

5. An electronic device comprising the MEMS device of claim 1.

6. The MEMS device of claim 4 wherein the moveable body is a pivoting proof mass of the accelerometer.

7. The MEMS device of claim 6 wherein the pivoting proof mass comprises a travel stop configured to impact the fixed surface in event of extreme acceleration.

8. The MEMS device of claim 7 wherein the major surface of the second polysilicon layer comprises the travel stop region.

* * * * *